United States Patent [19]
Kaufman

[11] Patent Number: 4,700,273
[45] Date of Patent: Oct. 13, 1987

[54] CIRCUIT ASSEMBLY WITH SEMICONDUCTOR EXPANSION MATCHED THERMAL PATH

[76] Inventor: Lance R. Kaufman, 131 N. White Oak Way, Mequon, Wis. 53092

[21] Appl. No.: 870,141

[22] Filed: Jun. 3, 1986

[51] Int. Cl.⁴ ............................................... H05K 7/20
[52] U.S. Cl. ...................... 361/388; 357/70; 357/80; 357/81; 361/400; 361/421
[58] Field of Search ............................. 357/70, 80, 81; 361/383, 384, 385, 386, 387, 388, 400, 401, 421

[56] References Cited

U.S. PATENT DOCUMENTS

| | | |
|---|---|---|
| 3,946,276 | 3/1976 | Braun et al. |
| 3,958,075 | 5/1976 | Kaufman . |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,257,091 | 3/1981 | Kaufman . |
| 4,266,140 | 5/1981 | Kaufman . |
| 4,394,530 | 7/1983 | Kaufman . |
| 4,396,971 | 8/1983 | Beall et al. . |
| 4,449,165 | 5/1984 | Kaufman . |
| 4,449,292 | 5/1984 | Kaufman . |
| 4,459,607 | 7/1984 | Reid ................................... 357/81 |
| 4,488,202 | 12/1984 | Kaufman . |
| 4,498,120 | 2/1985 | Kaufman . |
| 4,509,096 | 4/1985 | Baldwin et al. . |
| 4,546,410 | 10/1985 | Kaufman . |
| 4,546,411 | 10/1985 | Kaufman . |
| 4,550,333 | 10/1985 | Ridder ................................... 357/81 |
| 4,554,613 | 11/1985 | Kaufman . |
| 4,574,162 | 3/1986 | Kaufman . |
| 4,577,387 | 3/1986 | Kaufman . |

FOREIGN PATENT DOCUMENTS 2840514 3/1979 Fed. Rep. of Germany .
8877379 8/1979 Japan .

*Primary Examiner*—G. P. Tolin
*Attorney, Agent, or Firm*—Andrus, Sceales, Starke & Sawall

[57] ABSTRACT

A copper lead frame (16) has an aperture (18) through which a molybdenum layer (20) extends to directly contact a ceramic substrate (8) therebelow. A semiconductor chip (2) is mounted on the molybdenum layer (20). Thermal conductivity is improved because of the reduced number of thermal path conduction layers between the semiconductor chip (2) and the ceramic substrate (8). The arrangement also enables the chip-expansion-matched thermal conductor (20) to contact the semiconductor chip (2) and match expansion therewith.

4 Claims, 2 Drawing Figures

CIRCUIT ASSEMBLY WITH SEMICONDUCTOR EXPANSION MATCHED THERMAL PATH

BACKGROUND AND SUMMARY

The invention relates to electronic circuit assemblies for semiconductor chips. The assembly must provide an electrical connection path for current flow through the chip, and must also provide a thermal path to a heat sink to dissipate heat generated by the chip.

Examples of electronic circuit assemblies are shown in my previous U.S. Pat. Nos. 3,958,075, 4,156,148, 4,196,411, 4,215,235, 4,218,724, 4,250,481, 4,257,091, 4,266,140, 4,394,530, 4,449,165, 4,449,292, 4,488,202, 4,498,120, 4,546,410, 4,546,411, 4,554,613, 4,574,162 and 4,577,387, hereby incorporated by reference.

As shown in FIG. 1, it is known in the prior art to mount a silicon semiconductor chip 2 on a molybdenum material layer 4, such as molymanganese, which in turn is mounted on a copper lead frame 6 which in turn is mounted to an electrically insulating ceramic substrate 8 which in turn is mounted to a heat sink 10. Circuit connections are made to the silicon chip and to the copper lead frame at terminals 12 and 14. The current flow path between terminals 12 and 14 is through silicon chip 2 through molybdenum layer 4 and through copper lead frame 6. The thermal path from silicon chip 2 is through molybdenum layer 4 through copper lead frame 6 through ceramic substrate 8 to heat sink 10. Molybdenum layer 4 has a coefficient of thermal expansion close to that of silicon and hence provides a desirable thermal match therewith which prevents cracking of the chip during operation. A trade-off, however, is that the molybdenum constitutes an additional layer through which heat must travel to ceramic substrate 8, and hence increases thermal resistance.

The present invention provides an improvement over the structure of FIG. 1.

DETAILED DESCRIPTION

Figure 1:
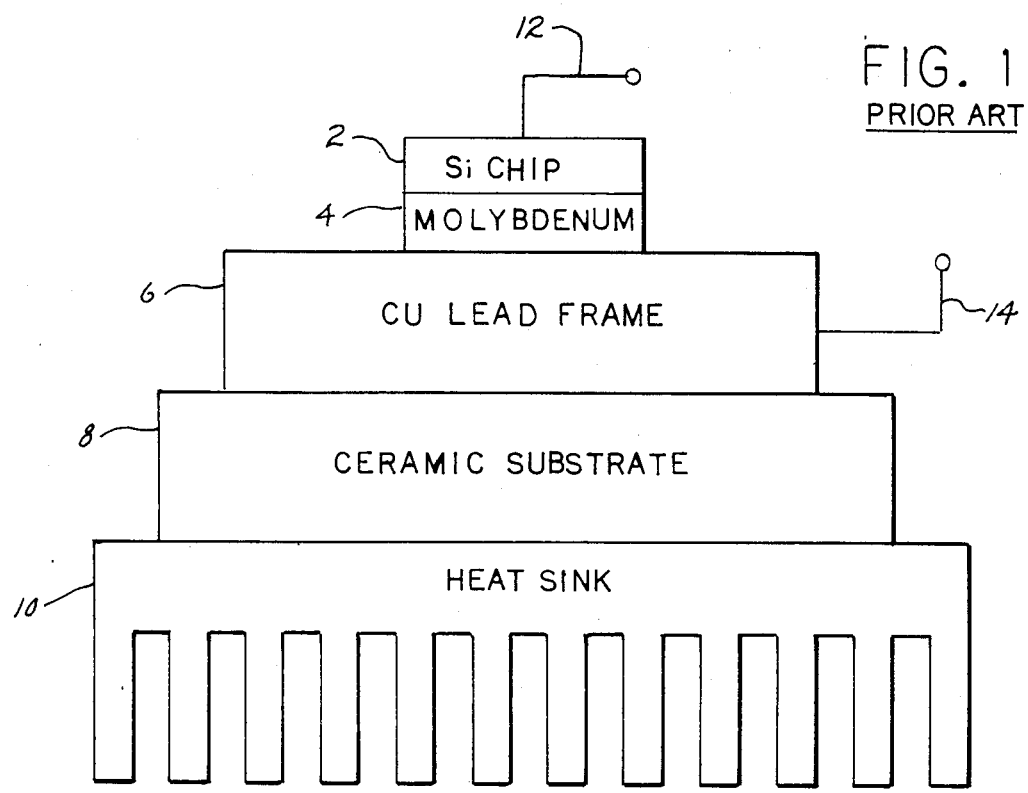
FIG. 1 is a schematic side view of an electronic circuit assembly known in the prior art.
Figure 2:
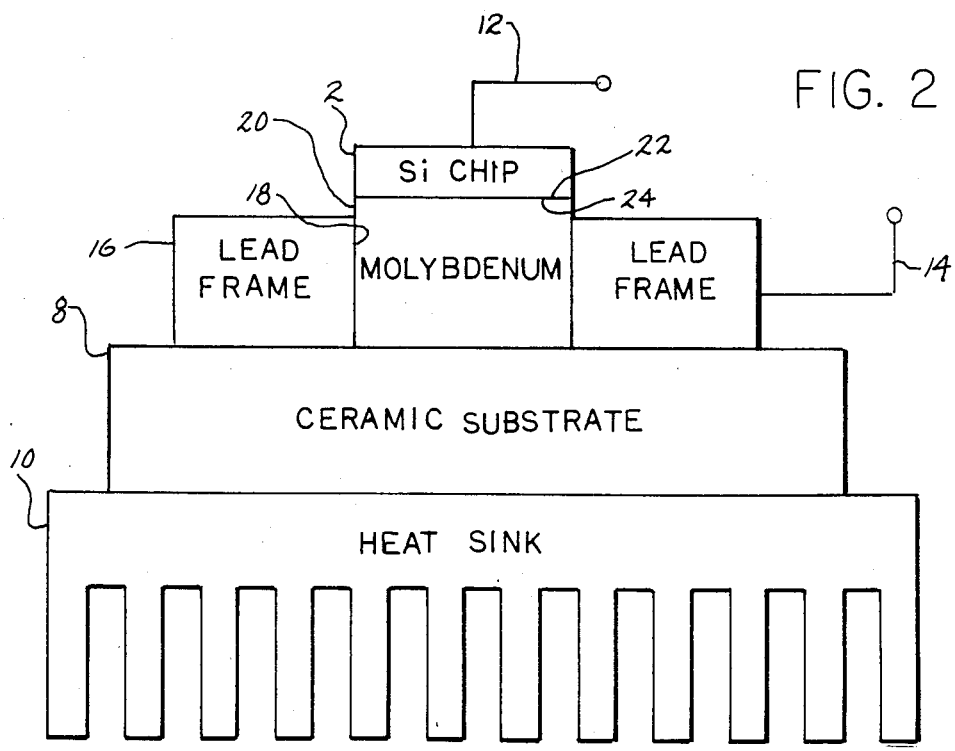
FIG. 2 is a schematic side view of a circuit assembly in accordance with the invention.

FIG. 2 uses like reference numerals from FIG. 1 where appropriate to facilitate clarity. Copper lead frame 16 is bonded on substrate 8 and has an aperture 18 therethrough. Molybdenum material 20 or a compound thereof, such as molymanganese, is disposed in aperture 18 and contacts lead frame 16 and substrate 8. Silicon chip 2 is mounted on molybdenum layer 20. The molybdenum has a volume greater than the volume defined by the area of aperture 18 times the height of lead frame 16. The planar horizontal undersurface 20 of chip 2 is mounted on a top planar horizontal surface 24 of the molybdenum and spaced above lead frame 16. An electrical path is provided from chip 2 through molybdenum layer 20 to lead frame 16 to complete a circuit between terminals 12 and 14, and provides the same electrical circuit connection as in FIG. 1. A thermal path is provided from chip 2 through molybdenum layer 20 to substrate 8 bypassing lead frame 16 which would otherwise present an extra thermal junction to be crossed as in FIG. 1.

Molybdenum layer 20 extends through lead frame 16 to directly contact ceramic substrate 8. This improves thermal conductivity because of the reduced number of thermal path conduction layers between the semiconductor chip and the ceramic substrate. The arrangement also enables the chip-expansion-matched thermal conductor, such as molybdenum, to contact the semiconductor chip and match expansion therewith.

It is recognized that various equivalents, alternatives and modifications are possible within the scope of the appended claims.

I claim:

1. An electronic circuit assembly comprising:
   an electrically insulative thermally conductive substrate;
   an electrically conductive lead frame bonded on said substrate, said lead frame having an aperture therethrough;
   a semiconductor chip;
   electrically conductive material disposed in said aperture and contacting and supporting said chip and contacting said lead frame and said substrate and having a coefficient of thermal expansion matched to said semiconductor chip, such that an electrical path is provided from said chip through said chip-expansion-matched material to said lead frame, and such that a thermal path is provided from said chip through said chip-expansion-matched material directly to said substrate bypassing said lead frame which would otherwise present an extra thermal junction to be crossed.

2. The invention according to claim 1 wherein said material has a volume greater than the volume defined by the area of said aperture times the height of said lead frame.

3. The invention according to claim 2 wherein said material has a top planar horizontal surface and wherein said chip has a planar horizontal undersurface mounted on said top planar horizontal surface of said material and spaced above said lead frame.

4. An electronic circuit assembly comprising:
   an electrically insulative thermally conductive substrate;
   an electrically conductive lead frame bonded on said substrate, said lead frame having an aperture therethrough;
   material selected from the group consisting of molybdenum and compounds thereof disposed in said aperture and contacting said lead frame and said substrate; and
   a semiconductor chip mounted on said material.

* * * * *